(12) United States Patent
Nakakuma et al.

(10) Patent No.: US 6,888,759 B2
(45) Date of Patent: May 3, 2005

(54) SEMICONDUCTOR DEVICE COMPRISING A DIFFERENTIAL SENSE AMPLIFIER, A WRITE COLUMN SELECTION SWITCH AND A READ COLUMN SELECTION SWITCH

(75) Inventors: Tetsuji Nakakuma, Shiga (JP); Hiroshige Hirano, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/644,744

(22) Filed: Aug. 21, 2003

(65) Prior Publication Data

US 2004/0047185 A1 Mar. 11, 2004

(30) Foreign Application Priority Data

Sep. 10, 2002 (JP) ........................................ 2002-263856

(51) Int. Cl.$^7$ ................................................ G11C 7/00
(52) U.S. Cl. .................................... 365/189.01; 365/190
(58) Field of Search ........................ 365/189.01, 189.05, 365/190

(56) References Cited

U.S. PATENT DOCUMENTS 4,984,207 A * 1/1991 Tateno et al. ............... 365/208
5,657,264 A * 8/1997 Yamauchi et al. ............ 365/49
6,091,629 A * 7/2000 Osada et al. ................ 365/156
6,788,561 B2 * 9/2004 Watanabe et al. ............. 365/63

FOREIGN PATENT DOCUMENTS

| JP | 5-28752 | 2/1993 |
|---|---|---|
| JP | 6-208786 | 7/1994 |

* cited by examiner

Primary Examiner—Son Mai
(74) Attorney, Agent, or Firm—McDermott Will & Emery LLP

(57) ABSTRACT

A semiconductor device includes a differential sense amplifier connected to a bit line, and a data transfer circuit including a column selection switch for turning ON/OFF the connection between a data line and the bit line. The semiconductor device incorporates one of the following features: the on-state resistance of the column selection switch being higher than that of a transistor array of the differential sense amplifier; separate provision of two column selection switches, one for read operation and the other for write operation; provision of a bit line additional capacitance and a connection control switch therefor; and provision of a data line dividing switch.

4 Claims, 9 Drawing Sheets

SEMICONDUCTOR DEVICE COMPRISING A DIFFERENTIAL SENSE AMPLIFIER, A WRITE COLUMN SELECTION SWITCH AND A READ COLUMN SELECTION SWITCH

BACKGROUND OF THE INVENTION

The present invention relates to a semiconductor memory device having sense amplifiers and data transfer circuits including column selection switches, and more particularly to a semiconductor memory device with means for preventing misreading of data.

FIG. 11 illustrates the circuit configuration of a sense amplifier section and a data transfer circuit section including a column selection switch in a conventional semiconductor memory device (see, for example, Japanese Laid-Open Patent Publication Nos. 5-28752 and 6-208786).

As illustrated in FIG. 11, when data is read from a selected memory cell (not shown) to a pair of bit lines BL and /BL, the potentials of the bit lines are amplified by a differential sense amplifier 1. In a case where the memory cell is a 1T1C-type cell including one transistor and one capacitor, the reference potential supplied to one of the pair of bit lines BL and /BL is amplified by the differential sense amplifier 1.

In order to activate the differential sense amplifier 1, a P-channel MOS transistor Qp1 and an N-channel MOS transistor Qn1 are turned ON by bringing a signal SA1 to a low level ("Lo") and a signal SA2 to a high level ("Hi"), respectively. When data of "1" is read out onto the bit line BL, for example, the potential of the bit line BL is eventually brought to the power supply voltage (Vcc) level and that of the bit line /BL to the GND level through differential amplification. As a result, a P-channel MOS transistor Qp2 and an N-channel MOS transistor Qn3 are turned ON, and a P-channel MOS transistor Qp3 and an N-channel MOS transistor Qn2 are turned OFF.

Then, a column selection signal SW is brought to a high level to turn ON a pair of N-channel MOS transistors Qn4 of a column selection switch 2, whereby data read out from the memory cell is transferred to a pair of data lines DL and /DL.

FIG. 12 illustrates the potential transition of the bit lines and the data lines when data is normally transferred from the bit lines to the data lines in the conventional semiconductor memory device illustrated in FIG. 11.

As illustrated in FIG. 12, when the sense amplifier 1 is activated, the pair of bit lines BL and /BL are at the power supply voltage level and the GND level, respectively. Then, as the column selection signal SW is brought from the low level to the high level, the N-channel MOS transistors Qn4 are turned ON, whereby a charge flows from the bit line BL to the data line DL to increase the potential of the data line DL. Note that at the moment the MOS transistors Qn4 are turned ON, there occurs a charge current to the data line DL, thereby decreasing the potential of the bit line BL. However, as the potential of the data line DL increases, the charge current decreases, whereby the potential of the bit line BL increases again back to the power supply voltage level. For the data line /DL, on the other hand, a slight potential increase is observed due to the interference between the data lines. Accordingly, the potential of the bit line /BL, which is connected to the data line /DL, also increases slightly. However, the potential of the bit line /BL is eventually brought back to the GND level.

In such a conventional semiconductor memory device, data may be corrupted or misread.

SUMMARY OF THE INVENTION

In view of the above, an object of the present invention is to prevent data from being corrupted or misread in a semiconductor memory device.

In order to achieve this object, the present inventors obtained the following findings by researching the possible causes for the corruption and misreading of data in the conventional semiconductor memory device.

In the sense amplifier 1 and the column selection switch 2 of the conventional semiconductor memory device, the line capacitance (dependent on the length of the data lines), the interline capacitance (dependent on the distance between data lines), or the like, is larger than the bit line load capacitance. Therefore, when the on-state resistance of the MOS transistor Qn4 of the column selection switch 2 is lower than the total on-state resistance of the MOS transistors Qp1 and Qp2 of the sense amplifier 1, data is likely to be misread in a read operation.

FIG. 13 illustrates the potential transition of the bit lines and the data lines when data is misread in the conventional semiconductor memory device illustrated in FIG. 11.

As illustrated in FIG. 13, when the sense amplifier 1 is activated, the pair of bit lines BL and /BL are at the power supply voltage level and the GND level, respectively. Then, as the column selection signal SW is brought from the low level to the high level, the N-channel MOS transistors Qn4 are turned ON, whereby a charge flows from the bit line BL to the data line DL to increase the potential of the data line DL. Note that at the moment the MOS transistors Qn4 are turned ON, there occurs a charge current to the data line DL, thereby decreasing the potential of the bit line BL. At this moment, the potential of the bit line BL decreases by a greater amount than that in the case of FIG. 12, if the data line capacitance is significantly larger than the bit line capacitance and if the on-state resistance of the MOS transistor Qn4 of the column selection switch 2 is lower than the total on-state resistance of the P-channel MOS transistors Qp1 and Qp2.

On the other hand, the potential increase of the data line /DL is also greater than that in the case of FIG. 12 because of the interference between the data lines due to the large capacitance between the data lines. Accordingly, the potential increase of the bit line /BL, which is connected to the data line /DL with a low resistance, is also greater than that in the case of FIG. 12. At the same time, as the level of the bit line BL decreases, the P-channel MOS transistor Qp3 is turned ON while the resistance of the N-channel MOS transistor Qn3 increases. Due to these factors combined together, the potential increase of the bit line /BL is greater than that in the case of FIG. 12. As a result, potential reversing occurs between the pair of bit lines BL and /BL, thus corrupting the data being read out.

The present invention has been obtained based on these findings. Specifically, a first semiconductor device of the present invention includes: a differential sense amplifier connected to a bit line; and a data transfer circuit including a column selection switch for turning ON/OFF connection between a data line and the bit line, wherein: the differential sense amplifier includes a power supply and a transistor array of at least one MOS transistor connecting the power supply with the bit line; and an on-state resistance of the column selection switch is higher than that of the transistor array.

With the first semiconductor device, although at the moment the column selection switch is turned ON (at the moment the data line and the bit line are connected to each other), there occurs a charge current from the bit line (one of bit lines that goes high) to the data line, the on-state resistance of the column selection switch is relatively high, whereby it is possible to suppress the potential decrease of the bit line. Therefore, the potential relationship between the pair of bit lines can be stabilized so that data is normally transferred from the bit line to the data line, whereby it is possible to prevent data from being corrupted or misread in a read operation.

In the first semiconductor device, it is preferred that the bit line includes a first bit line and a second bit line that go high and low, respectively, when the differential sense amplifier is activated in a read operation; the differential sense amplifier includes a P-channel MOS transistor connecting the power supply with the second bit line; and a potential of the first bit line is higher than a threshold of the P-channel MOS transistor.

In this way, even if the potential of the data line connected to the bit line that goes low is slightly increased by the interference between the data lines, thereby causing a slight potential increase also in the bit line, no further potential increase will occur in the bit line. Therefore, the potential relationship between the pair of bit lines can be further stabilized, whereby it is possible to more reliably prevent data from being corrupted or misread in a read operation.

A second semiconductor device of the present invention includes: a differential sense amplifier connected to a bit line; and a data transfer circuit including a column selection switch for turning ON/OFF connection between a data line and the bit line, wherein the column selection switch includes a read column selection switch and a write column selection switch.

With the second semiconductor device, the column selection switch includes a read column selection switch (a column selection switch for read operation) and a write column selection switch (a column selection switch for write operation), whereby only the on-state resistance of the read column selection switch can be increased without increasing that of the write column selection switch. Therefore, the on-state resistance of the read column selection switch can be made higher than that of the transistor array (an array of transistors connecting the power supply of the sense amplifier with the bit lines) of the differential sense amplifier. Thus, similar effects to those of the first semiconductor device can be obtained.

In the second semiconductor device, it is preferred that an on-state resistance of the read column selection switch is higher than that of the write column selection switch.

In this way, the on-state resistance of the write column selection switch (i.e., the on-state resistance of the MOS transistor for write operation) is small, whereby it is possible to perform a stable and fast write operation.

In the second semiconductor device, it is preferred that the read column selection switch and the write column selection switch are connected to the data line via a common impurity diffusion layer.

In this way, it is possible to minimize the increase in the layout area that entails the provision of column selection switches separately for read and write operations.

In the second semiconductor device, it is preferred that the read column selection switch and the write column selection switch along one of a pair of columns adjacent to each other are connected to the same data line as the read column selection switch and the write column selection switch, respectively, along the other one of the pair of columns; and a pair of the read column selection switches for the pair of columns are connected to the same data line via a common impurity diffusion layer, and a pair of the write column selection switches for the pair of columns are connected to the same data line via a common impurity diffusion layer.

In this way, it is possible to minimize the increase in the layout area that entails the provision of column selection switches separately for read and write operations.

A third semiconductor device of the present invention includes: a differential sense amplifier connected to a bit line; a data transfer circuit including a column selection switch for turning ON/OFF connection between a data line and the bit line; and a capacitance control switch for turning ON/OFF connection between an additional capacitor and the bit line, wherein the additional capacitor and the bit line are connected to each other by the capacitance control switch after the differential sense amplifier is activated in a read operation and before the data line and the bit line are connected to each other by the column selection switch.

With the third semiconductor device, although at the moment the column selection switch is turned ON (at the moment the data line and the bit line are connected to each other), there occurs a charge current from the bit line (one of bit lines that goes high) to the data line, the total capacitance of the bit line is sufficiently large due to the provision of the additional capacitor, whereby it is possible to suppress the potential decrease of the bit line. Moreover, since the total capacitance of the bit line that goes high is sufficiently large, the potential of the bit line will not be less than or equal to the threshold of the P-channel MOS transistor that connects the bit line that goes low with the power supply of the differential sense amplifier. Thus, even if the potential of the data line connected to the bit line that goes low is slightly increased by the interference between the data lines, thereby causing a slight potential increase also in the bit line, no further potential increase will occur in the bit line. Therefore, the potential relationship between the pair of bit lines can be further stabilized so that data is normally transferred from the bit line to the data line, whereby it is possible to more reliably prevent data from being corrupted or misread in a read operation.

A fourth semiconductor device of the present invention includes: a differential sense amplifier connected to a bit line; a data transfer circuit including a column selection switch for turning ON/OFF connection between a data line and the bit line; and a data line dividing switch for selectively dividing or not dividing the data line, wherein the data line is divided by the data line dividing switch until the differential sense amplifier is activated in a read operation and the data line and the bit line are connected to each other by the column selection switch.

With the fourth semiconductor device, although at the moment the column selection switch is turned ON (at the moment the data line and the bit line are connected to each other), there occurs a charge current from the bit line (one of bit lines that goes high) to the data line, the total capacitance of the data line is sufficiently small due to the division of the data line by the data line dividing switch, whereby it is possible to suppress the potential decrease of the bit line that goes high. Moreover, since the total capacitance of the data line is sufficiently small, the potential of the bit line that goes high will not be less than or equal to the threshold of the P-channel MOS transistor that connects the bit line that goes low with the power supply of the differential sense amplifier.

Thus, even if the potential of the data line connected to the bit line that goes low is slightly increased by the interference between the data lines, thereby causing a slight potential increase also in the bit line, no further potential increase will occur in the bit line. Therefore, the potential relationship between the pair of bit lines can be further stabilized so that data is normally transferred from the bit line to the data line, whereby it is possible to more reliably prevent data from being corrupted or misread in a read operation.

As described above, according to the present invention, it is possible to prevent data from being corrupted due to potential reversing between the complementary bit lines when the column selection switch is turned ON in a read operation by incorporating one of the following features: optimization of the ratio between the on-state resistance of the column selection switch and the total on-state resistance of the P-channel MOS transistors of the differential sense amplifier; separate provision of two column selection switches, one for read operation and the other for write operation; provision of the bit line additional capacitance and the connection control switch therefor for improving the load capacitance ratio between the bit line and the data line; and provision of the data line dividing switch. Moreover, in a case where separate column selection switches are provided for read and write operations, it is possible to minimize the increase in the layout area if the read and write column selection switches along the same column are connected to the data line via a common impurity diffusion layer, or if a pair of read column selection switches (and a pair of write column selection switches) along a pair of adjacent columns are connected to the data line via a common impurity diffusion layer.

DETAILED DESCRIPTION OF THE INVENTION

First Embodiment

A semiconductor device according to the first embodiment of the present invention, more specifically, a semiconductor memory device having sense amplifiers and data transfer circuits including column selection switches, will now be described with reference to the drawings.

Figure 1:
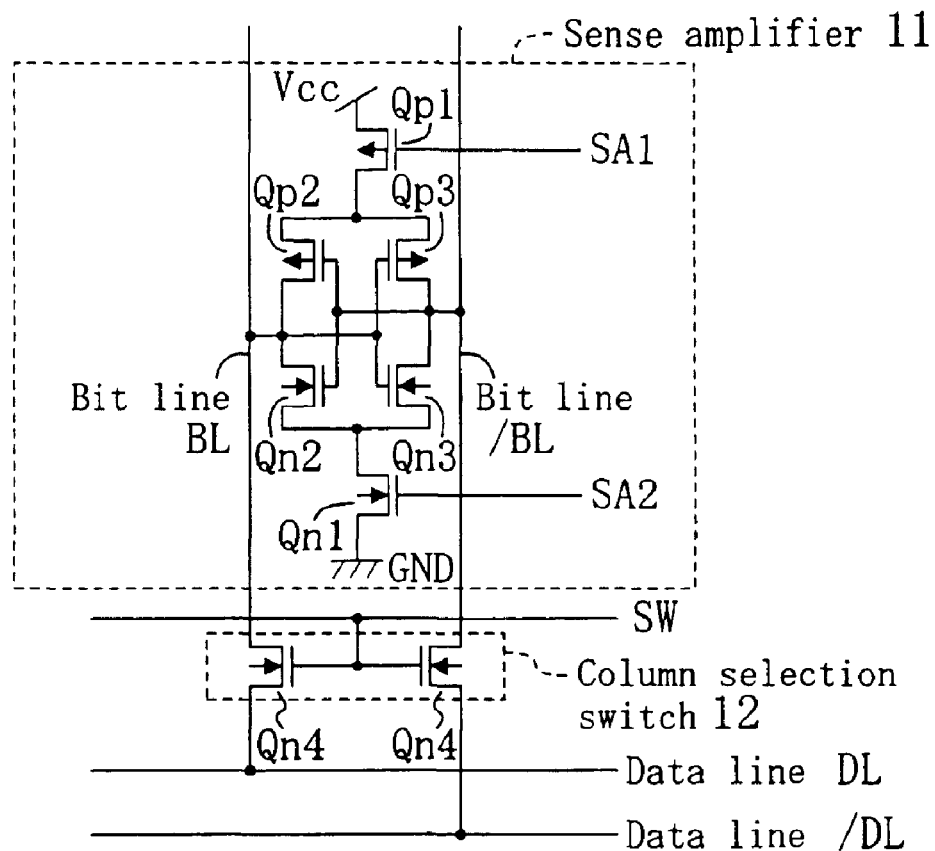
FIG. 1 illustrates the circuit configuration of a sense amplifier section and a data transfer circuit section including a column selection switch in a semiconductor device according to a first embodiment of the present invention.

FIG. 1 illustrates the circuit configuration of a sense amplifier section and a data transfer circuit section including a column selection switch in a semiconductor device according to the first embodiment.

As illustrated in FIG. 1, a sense amplifier 11 of the semiconductor device of the present embodiment includes the first, second and third P-channel MOS transistors Qp1, Qp2 and Qp3, and the first, second and third N-channel MOS transistors Qn1, Qn2 and Qn3.

The source electrode of the first P-channel MOS transistor Qp1 is connected to the power supply of the sense amplifier 11. The signal SA1 for controlling the operation of the sense amplifier 11 is input to the gate electrode of the first P-channel MOS transistor Qp1. The source electrodes of the second and third P-channel MOS transistors Qp2 and Qp3 are connected to the first P-channel MOS transistor Qp1. The gate electrode and the drain electrode of the second P-channel MOS transistor Qp2 are connected to the bit line /BL and the bit line BL, respectively. The gate electrode and the drain electrode of the third P-channel MOS transistor Qp3 are connected to the bit line BL and the bit line /BL, respectively.

The source electrode of the first N-channel MOS transistor Qn1 is grounded. The signal SA2 for controlling the operation of the sense amplifier 11 is input to the gate electrode of the first N-channel MOS transistor Qn1. The source electrodes of the second and third N-channel MOS transistors Qn2 and Qn3 are connected to the first N-channel MOS transistor Qn1. The gate electrode and the drain electrode of the second N-channel MOS transistor Qn2 are connected to the bit line /BL and the bit line BL, respectively. The gate electrode and the drain electrode of the third N-channel MOS transistor Qn3 are connected to the bit line BL and the bit line /BL, respectively.

On the other hand, a column selection switch 12 of the semiconductor device of the present embodiment for turning ON/OFF the connection between the pair of bit lines BL and /BL and the pair of data lines DL and /DL includes the pair of N-channel MOS transistors Qn4. The column selection signal SW is input to the gate electrode of each N-channel MOS transistor Qn4.

A feature of the present embodiment is that the on-state resistance of the MOS transistor Qn4 of the column selection switch 12 is higher than the total on-state resistance of the MOS transistors Qp1 and Qp2 when the sense amplifier 11 is activated to bring the bit line BL to the high level.

The operation of the semiconductor device of the present embodiment will now be described in detail.

When data is read from a selected memory cell (not shown) to the pair of bit lines BL and /BL, the potentials of the bit lines are amplified by the differential sense amplifier 11. In a case where the memory cell is a 1T1C-type cell including one transistor and one capacitor, the reference potential supplied to one of the pair of bit lines BL and /BL is amplified by the differential sense amplifier 11.

In order to activate the differential sense amplifier 11, the P-channel MOS transistor Qp1 and the N-channel MOS transistor Qn1 are turned ON by bringing the signal SA1 to the low level and the signal SA2 to the high level, respectively. When data of "1" is read out onto the bit line BL, for example, the potential of the bit line BL is eventually brought to the power supply voltage (Vcc) level and that of the bit line /BL to the GND level through differential amplification. As a result, the P-channel MOS transistor Qp2 and the N-channel MOS transistor Qn3 are turned ON, and the P-channel MOS transistor Qp3 and the N-channel MOS transistor Qn2 are turned OFF.

Then, the column selection signal SW is brought to the high level to turn ON the N-channel MOS transistors Qn4 of the column selection switch 12, whereby data read out from the memory cell is transferred to the pair of data lines DL and /DL.

Figure 2:
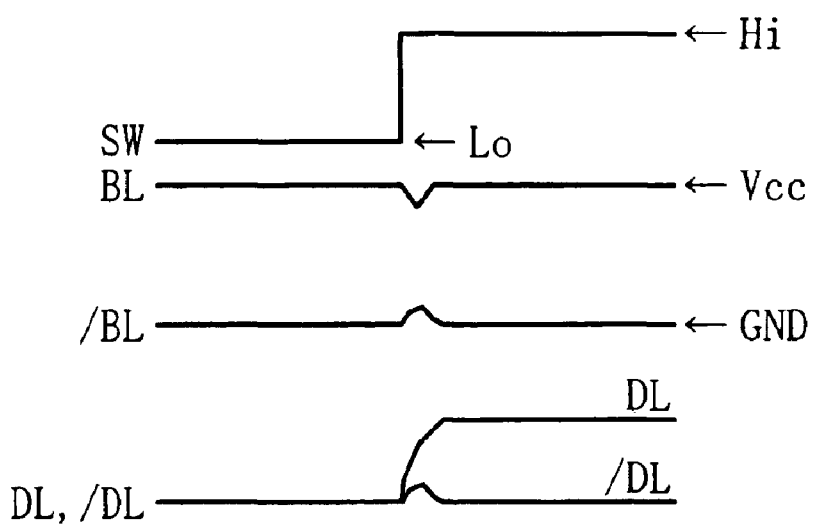
FIG. 2 illustrates the potential transition of the bit lines and the data lines when data is normally transferred from the bit lines to the data lines in a semiconductor device according to the first embodiment of the present invention.

FIG. 2 illustrates the potential transition of the bit lines and the data lines when data is normally transferred from the bit lines to the data lines in the semiconductor device of the present embodiment illustrated in FIG. 1.

As illustrated in FIG. 2, when the sense amplifier 11 is activated, the pair of bit lines BL and /BL are at the power supply voltage level and the GND level, respectively. Then, as the column selection signal SW is brought from the low level to the high level, the N-channel MOS transistors Qn4 of the column selection switch 12 are turned ON, whereby a charge flows from the bit line BL to the data line DL to increase the potential of the data line DL. Note that at the moment the MOS transistors Qn4 are turned ON, there occurs a charge current to the data line DL. However, since the on-state resistance of the MOS transistor Qn4 is relatively high, the potential decrease of the bit line BL is small. Moreover, since the total on-state resistance of the transistor array (the MOS transistors Qp1 and Qp2) of the sense amplifier 11 is lower than the on-state resistance of the MOS transistor Qn4, the potential of the bit line BL will not be less than or equal to the threshold of the P-channel MOS transistor Qp3 that connects the bit line /BL with the power supply of the sense amplifier 11. Thus, the MOS transistor Qp3 is not turned ON, whereby the MOS transistor Qn3 is sufficiently ON. Therefore, even if the potential of the data line /DL is slightly increased by the interference between the data lines, thereby causing a slight potential increase also in the bit line /BL connected to the data line /DL, no further potential increase will occur in the bit line /BL.

Therefore, according to the first embodiment, the potential relationship between the pair of bit lines BL and /BL can be stabilized so that data is normally transferred from the bit line BL or /BL to the data line DL or /DL, whereby it is possible to prevent data from being corrupted or misread in a read operation.

Second Embodiment

A semiconductor device according to the second embodiment of the present invention, more specifically, a semiconductor memory device having sense amplifiers and data transfer circuits including column selection switches, will now be described with reference to the drawings.

The second embodiment differs from the first embodiment in that the column selection switch of the semiconductor device of the second embodiment includes a read column selection switch and a write column selection switch.

Figure 3:
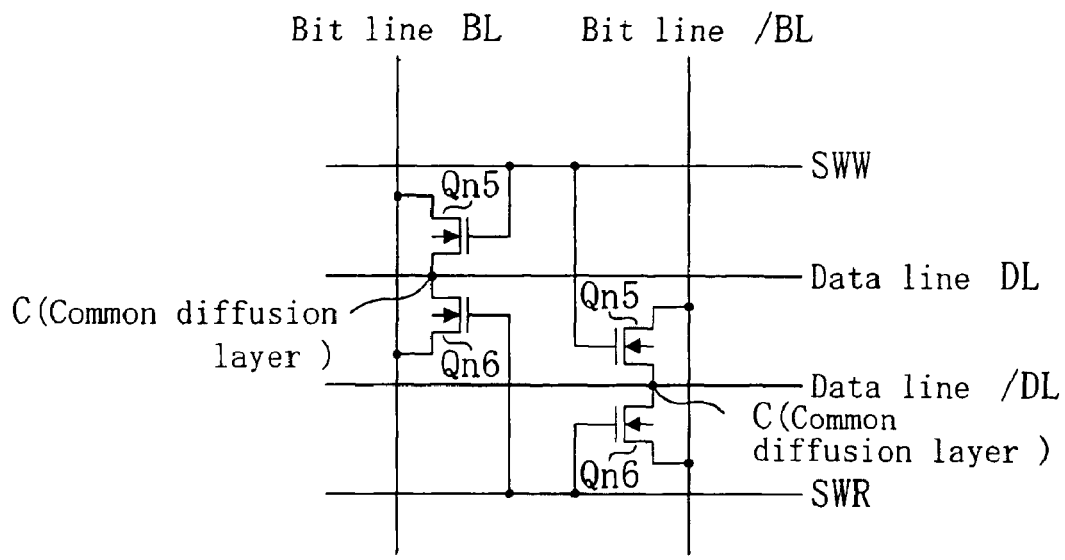
FIG. 3 illustrates the circuit configuration of a data transfer circuit section including a column selection switch in a semiconductor device according to a second embodiment of the present invention.

FIG. 3 illustrates the circuit configuration of a data transfer circuit section including a column selection switch in the semiconductor device according to the second embodiment of the present invention. Note that the sense amplifier of the semiconductor device of the present embodiment (not shown) is similar to the sense amplifier 11 of the first embodiment illustrated in FIG. 1.

As illustrated in FIG. 3, the column selection switch of the semiconductor device of the present embodiment for turning ON/OFF the connection between the pair of bit lines BL and /BL and the pair of data lines DL and /DL includes a pair of N-channel MOS transistors Qn5, each being a switch for write operation, and a pair of N-channel MOS transistors Qn6, each being a switch for read operation. A control signal SWW for write operation is input to the gate electrode of each N-channel MOS transistor Qn5, and a control signal SWR for read operation is input to the gate electrode of each N-channel MOS transistor Qn6.

A first feature of the present embodiment is that the on-state resistance of the N-channel MOS transistor Qn6 is higher than that of the N-channel MOS transistor Qn5.

A second feature of the present embodiment is that the N-channel MOS transistor Qn5 (MOS transistor for write operation) and the N-channel MOS transistor Qn6 (MOS transistor for read operation) are connected to the data line DL or the data line /DL via a common impurity diffusion layer. In other words, the N-channel MOS transistors Qn5 and the N-channel MOS transistors Qn6 include a common impurity diffusion layer connected to the data line DL or the data line /DL.

Figure 4:
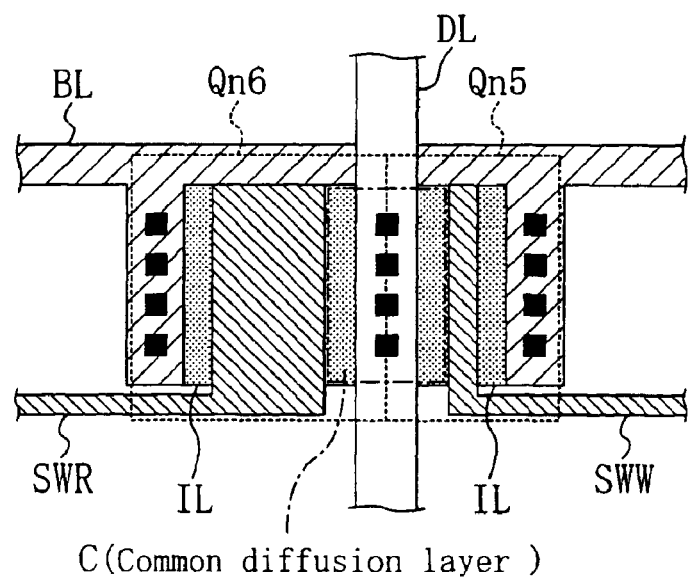
FIG. 4 illustrates the layout of the column selection switch in the semiconductor device according to the second embodiment of the present invention.

FIG. 4 schematically illustrates the layout of a part of the column selection switch of the present embodiment around the junction where the MOS transistor Qn5 and the MOS transistor Qn6 are connected to the data line DL. Note that each solid square symbol in FIG. 4 represents a plug that connects a transistor with the bit line BL or the data line DL. Moreover, "IL" (dotted area) represents the impurity diffusion layer. As illustrated in FIG. 4, the MOS transistor Qn5 and the MOS transistor Qn6 are connected to the data line DL via a common impurity diffusion layer C. In other words, the N-channel MOS transistors Qn5 and the N-channel MOS transistors Qn6 include a common impurity diffusion layer C connected to the data line DL.

The operation of the semiconductor device of the present embodiment will now be described in detail.

First, in a read operation, the control signal SWR transitions from the low level to the high level while the control signal SWW stays at the low level, whereby the MOS transistors Qn6 having a relatively high on-state resistance are turned ON, and data is transferred from the bit lines BL and /BL to the data lines DL and /DL, respectively.

In a write operation, the control signal SWW transitions from the low level to the high level while the control signal SWR stays at the low level, whereby the MOS transistors Qn5 having a relatively low on-state resistance are turned ON, and data is transferred from the data lines DL and /DL to the bit lines BL and /BL, respectively.

Note that it is assumed also in the present embodiment that the on-state resistance of the MOS transistor Qn6, being a read column selection switch, is higher than the total on-state resistance of the transistor array (the MOS transistors Qp1 and Qp2 in FIG. 1) of the sense amplifier when the sense amplifier is activated to bring the bit line BL to the high level. Thus, as in the first embodiment, the potential relationship between the pair of bit lines BL and /BL can be stabilized so that data is normally transferred from the bit line BL or /BL to the data line DL or /DL, whereby it is possible to prevent data from being corrupted or misread in a read operation.

According to the second embodiment, the column selection switch includes a read column selection switch and a write column selection switch, whereby only the on-state resistance of the read column selection switch can be increased without increasing that of the write column selection switch. Therefore, the on-state resistance of the read column selection switch can be made higher than that of the transistor array of the differential sense amplifier. Thus, similar effects to those of the first embodiment can be obtained.

Moreover, according to the second embodiment, the MOS transistors Qn5 for write operation, each having a relatively low on-state resistance, are used as write column selection switches, whereby it is possible to perform a stable and fast write operation.

Furthermore, according to the second embodiment, the read column selection switch and the write column selection switch are connected to the data line DL or /DL via a common impurity diffusion layer, thereby minimizing the increase in the layout area that entails the provision of column selection switches separately for read and write operations.

Third Embodiment

A semiconductor device according to the third embodiment of the present invention, more specifically, a semiconductor memory device having sense amplifiers and data transfer circuits including column selection switches, will now be described with reference to the drawings.

The third embodiment differs from the first embodiment in that the column selection switch of the semiconductor device of the third embodiment includes a read column selection switch and a write column selection switch.

Figure 5:
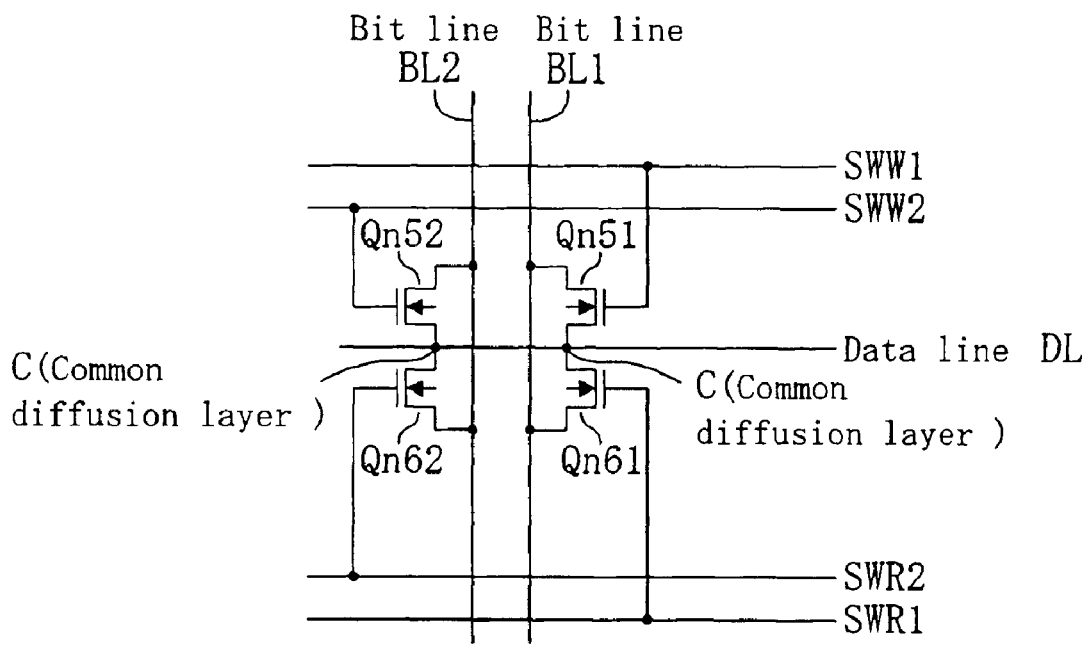
FIG. 5 illustrates the circuit configuration of a data transfer circuit section including a column selection switch in a semiconductor device according to a third embodiment of the present invention.

FIG. 5 illustrates the circuit configuration of a data transfer circuit section including a column selection switch in the semiconductor device according to the third embodiment of the present invention. Note that the sense amplifier of the semiconductor device of the present embodiment (not shown) is similar to the sense amplifier 11 of the first embodiment illustrated in FIG. 1. FIG. 5 only shows a portion of two column selection switches for a pair of adjacent sense amplifiers (in other words, a pair of column selection switches along the pair of adjacent columns) for turning ON/OFF the connection between the data line DL and one of each of two pairs of bit lines (a bit line BL1 and a bit line BL2) that are connected to the pair of adjacent sense amplifiers. Thus, FIG. 5 does not show the rest of the column selection switches that are for turning ON/OFF the connection between the data line /DL and the other one of each of the two pairs of bit lines (a bit line /BL1 and a bit line /BL2).

As illustrated in FIG. 5, one column selection switch of the semiconductor device of the present embodiment, i.e., a column selection switch for turning ON/OFF the connection between the bit line BL1 (and /BL1) and the data line DL (and /DL), includes an N-channel MOS transistor Qn51, being a switch for write operation, and an N-channel MOS transistor Qn61, being a switch for read operation. A control signal SWW1 for write operation is input to the gate electrode of the MOS transistor Qn51, and a control signal SWR1 for read operation is input to the gate electrode of the MOS transistor Qn61.

The other column selection switch of the semiconductor device of the present embodiment, i.e., a column selection switch for turning ON/OFF the connection between the bit line BL2 (and /BL2) and the data line DL (and /DL), includes an N-channel MOS transistor Qn52, being a switch for write operation, and an N-channel MOS transistor Qn62, being a switch for read operation. A control signal SWW2 for write operation is input to the gate electrode of the MOS transistor Qn52, and a control signal SWR2 for read operation is input to the gate electrode of the MOS transistor Qn62.

A first feature of the present embodiment is that the on-state resistance of the N-channel MOS transistor Qn61 is higher than that of the N-channel MOS transistor Qn51, while the on-state resistance of the N-channel MOS transistor Qn62 is higher than that of the N-channel MOS transistor Qn52.

A second feature of the present embodiment is that the MOS transistors Qn51 and Qn61 along one column are connected to the data line DL (or the data line /DL) via a common impurity diffusion layer, while the MOS transistors Qn52 and Qn62 along an adjacent column are connected to the data line DL (or the data line /DL) via a common impurity diffusion layer. In other words, the N-channel MOS transistors Qn51 and Qn61 include a common impurity diffusion layer connected to the data line DL or the data line /DL while the N-channel MOS transistors Qn52 and Qn62 include a common impurity diffusion layer connected to the data line DL or the data line /DL.

A third feature of the present embodiment is that the MOS transistors Qn51 and Qn52 along a pair of adjacent columns are connected to the data line DL (or the data line /DL) via a common impurity diffusion layer, while the MOS transistors Qn61 and Qn62 along the pair of adjacent columns are connected to the data line DL (or the data line /DL) via a common impurity diffusion layer. In other words, the N-channel MOS transistors Qn51 and Qn52 include a common impurity diffusion layer connected to the data line DL or the data line /DL while the N-channel MOS transistors Qn61 and Qn62 include a common impurity diffusion layer connected to the data line DL or the data line /DL.

Figure 6:
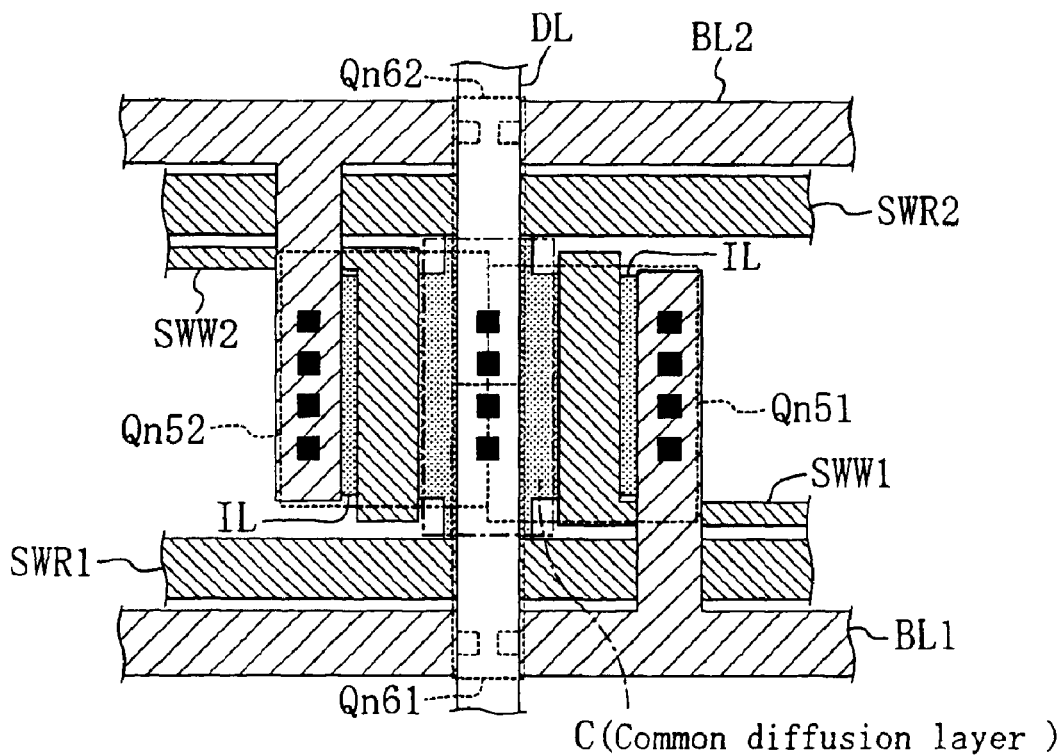
FIG. 6 illustrates the layout of the column selection switch in the semiconductor device according to the third embodiment of the present invention.

FIG. 6 schematically illustrates the layout of a part of the pair of column selection switches of the present embodiment around the junction where the MOS transistors Qn51, QnS2, Qn61 and Qn62 are connected to the data line DL. Note that each solid square symbol in FIG. 6 represents a plug that connects a transistor with the bit line BL1, the bit line BL2 or the data line DL (some of the plugs are represented by a broken-line open square symbol). Moreover, "IL" (dotted area) represents the impurity diffusion layer. As illustrated in FIG. 6, the MOS transistors Qn51, Qn52, Qn61 and Qn62 are connected to the data line DL via the common impurity diffusion layer C. In other words, the N-channel MOS transistors Qn51, Qn52, Qn61 and Qn62 include a common impurity diffusion layer C connected to the data line DL.

The operation of the semiconductor device of the present embodiment will now be described in detail.

First, in a read operation, the control signal SWR1 or SWR2 transitions from the low level to the high level while the control signal SWW1 or SWW2 stays at the low level, whereby the MOS transistor Qn61 or Qn62 having a relatively high on-state resistance is turned ON, and data is transferred from the bit line BL1 (and /BL1) or the bit line BL2 (and /BL2) to the data line DL (and /DL).

In a write operation, the control signal SWW 1 or SWW2 transitions from the low level to the high level while the control signal SWR1 or SWR2 stays at the low level, whereby the MOS transistor Qn51 or QnS2 having a relatively low on-state resistance is turned ON, and data is transferred from the data line DL (and /DL) to the bit line BL1 (and /BL1) or the bit line BL2 (and /BL2).

Note that it is assumed also in the present embodiment that when one of the sense amplifiers is activated to bring the bit line BL1 or BL2 to the high level, the on-state resistance of the MOS transistor Qn61 or Qn62, being a read column selection switch, is higher than the total on-state resistance of the transistor array (at least one P-channel MOS transistor that connects the power supply of the sense amplifier with a bit line) of the activated sense amplifier. Thus, as in the first embodiment, the potential relationship between the bit lines BL1 and /BL1 or that between the bit line BL2 and /BL2 can be stabilized so that data is normally transferred from the bit line BL1 and /BL1 or the bit line BL2 and /BL2 to the data lines DL and /DL, whereby it is possible to prevent data from being corrupted or misread in a read operation.

According to the third embodiment, the column selection switch includes a read column selection switch and a write column selection switch, whereby only the on-state resistance of the read column selection switch can be increased without increasing that of the write column selection switch. Therefore, the on-state resistance of the read column selection switch can be made higher than that of the transistor array of the differential sense amplifier. Thus, similar effects to those of the first embodiment can be obtained.

Moreover, according to the third embodiment, MOS transistors for write operation, each having a relatively low on-state resistance, are used as write column selection switches, whereby it is possible to perform a stable and fast write operation.

Furthermore, according to the third embodiment, the read column selection switch and the write column selection switch along the same column are connected to the data line DL (or /DL) via a common impurity diffusion layer. Moreover, a pair of read column selection switches along a pair of adjacent columns are connected to the data line DL (or /DL) via a common impurity diffusion layer, and a pair of write column selection switches along the pair of adjacent columns are connected to the data line DL (or /DL) via a common impurity diffusion layer. Thus, it is possible to minimize the increase in the layout area that entails the provision of column selection switches separately for read and write operations.

Fourth Embodiment

A semiconductor device according to the fourth embodiment of the present invention, more specifically, a semiconductor memory device having sense amplifiers and data transfer circuits including column selection switches, will now be described with reference to the drawings.

Figure 7:
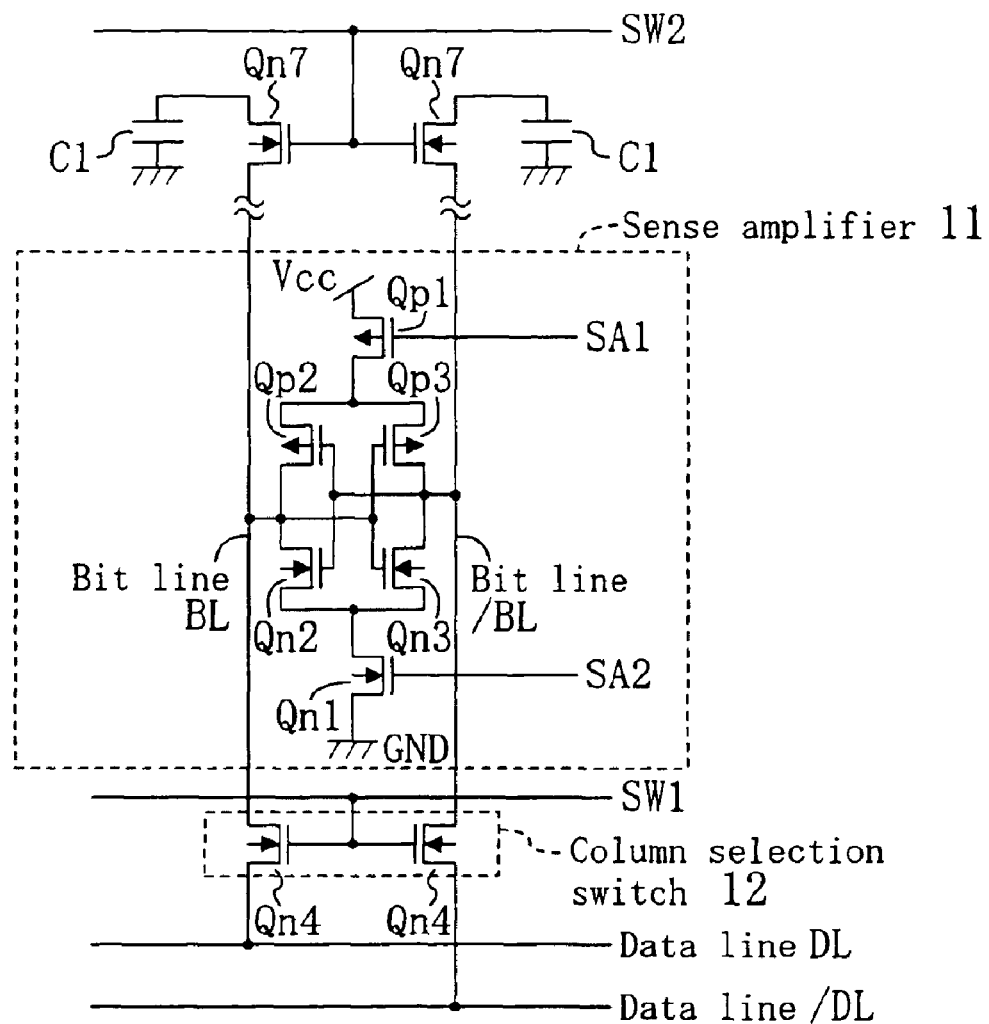
FIG. 7 illustrates the circuit configuration of a sense amplifier section and a data transfer circuit section including a column selection switch in a semiconductor memory device according to a fourth embodiment of the present invention.

FIG. 7 illustrates the circuit configuration of a sense amplifier section and a data transfer circuit section including a column selection switch in the semiconductor device according to the fourth embodiment.

As illustrated in FIG. 7, the sense amplifier 11 of the semiconductor device of the present embodiment includes the first, second and third P-channel MOS transistors Qp1, Qp2 and Qp3 and the first, second and third N-channel MOS transistors Qn1, Qn2 and Qn3, as in the first embodiment.

Moreover, the column selection switch 12 of the semiconductor device of the present embodiment for turning ON/OFF the connection between the pair of bit lines BL and /BL and the pair of data lines DL and /DL includes the pair of N-channel MOS transistors Qn4, as in the first embodiment. The column selection signal SW1 is input to the gate electrode of each N-channel MOS transistor Qn4.

A feature of the present embodiment is that each of the pair of bit lines BL and /BL is provided with a bit line additional capacitor C1 connected thereto via an N-channel MOS transistor Qn7, being a capacitance control switch, for increasing the total capacitance of the bit line. A control signal SW2 is input to the gate electrode of each N-channel MOS transistor Qn7.

Figure 8:
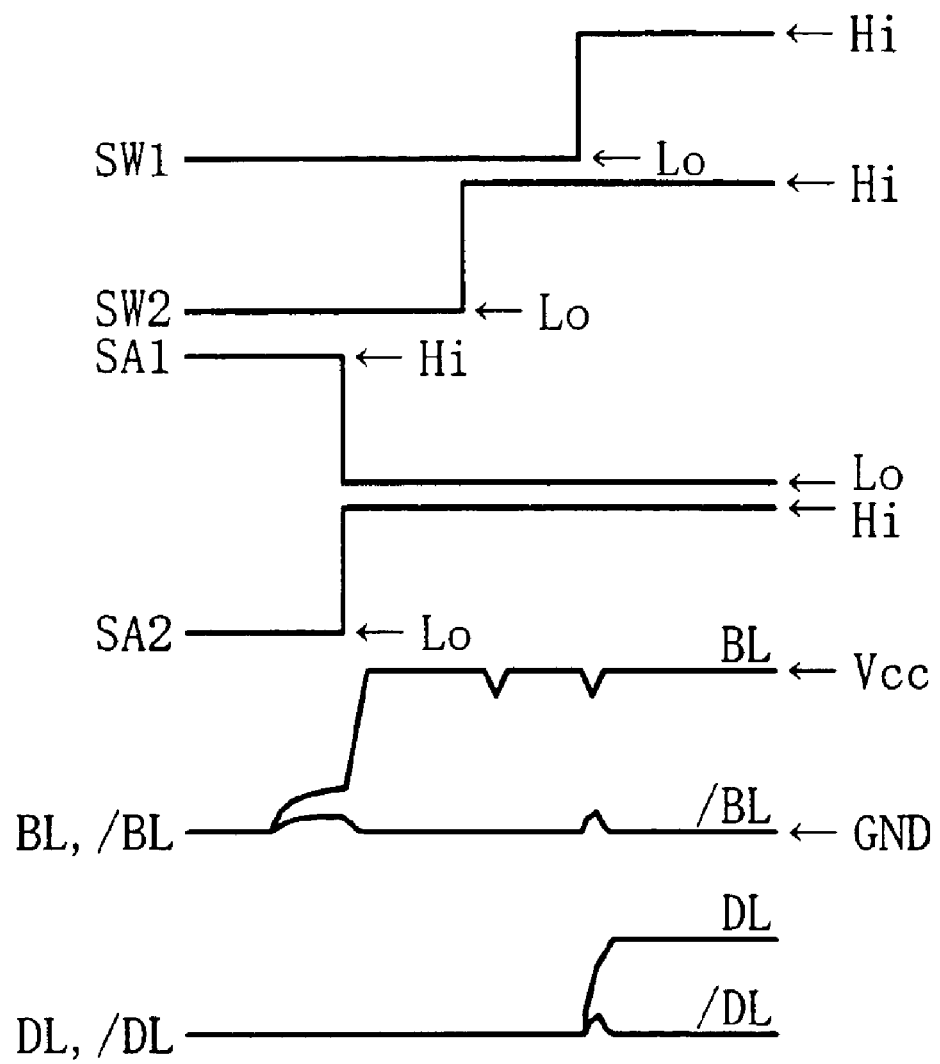
FIG. 8 is a timing chart illustrating a read operation of the semiconductor device according to the fourth embodiment of the present invention.

Next, the operation of the semiconductor device of the present embodiment will be described in detail with reference to the timing chart of FIG. 8.

After data is read from a selected memory cell (not shown) to the bit lines BL and /BL, the state of each of the control signals SA1 and SA2 is transitioned so as to activate the sense amplifier 11. Then, the control signal SW2 is brought from the low level to the high level so as to connect the bit line additional capacitors C1 to the respective bit lines BL and /BL, thereby increasing the total capacitance of each of the bit lines BL and /BL. Then, as the column selection signal SW1 is brought from the low level to the high level, the MOS transistors Qn4 of the column selection switch 12 are turned ON, whereby a charge flows from the bit line BL to the data line DL to increase the potential of the data line DL.

Note that at the moment the MOS transistors Qn4 are turned ON, there occurs a charge current to the data line DL. However, since the total capacitance of the bit line BL is sufficiently large, the potential decrease of the bit line BL is small. Moreover, since the total capacitance of the bit line BL is sufficiently large, the potential of the bit line BL at this moment will not be less than or equal to the threshold of the P-channel MOS transistor Qp3 that connects the bit line /BL with the power supply of the sense amplifier 11. Thus, the MOS transistor Qp3 is not turned ON, whereby the MOS transistor Qn3 is sufficiently ON. Therefore, even if the potential of the data line /DL is slightly increased by the interference between the data lines, thereby causing a slight potential increase also in the bit line /BL connected to the data line /DL, no further potential increase will occur in the bit line /BL.

Therefore, according to the fourth embodiment, the potential relationship between the pair of bit lines BL and /BL can be stabilized so that data is normally transferred from the bit line BL or /BL to the data line DL or /DL, whereby it is possible to prevent data from being corrupted or misread in a read operation.

Fifth Embodiment

A semiconductor device according to the fifth embodiment of the present invention, more specifically, a semiconductor memory device having sense amplifiers and data transfer circuits including column selection switches, will now be described with reference to the drawings.

Figure 9:
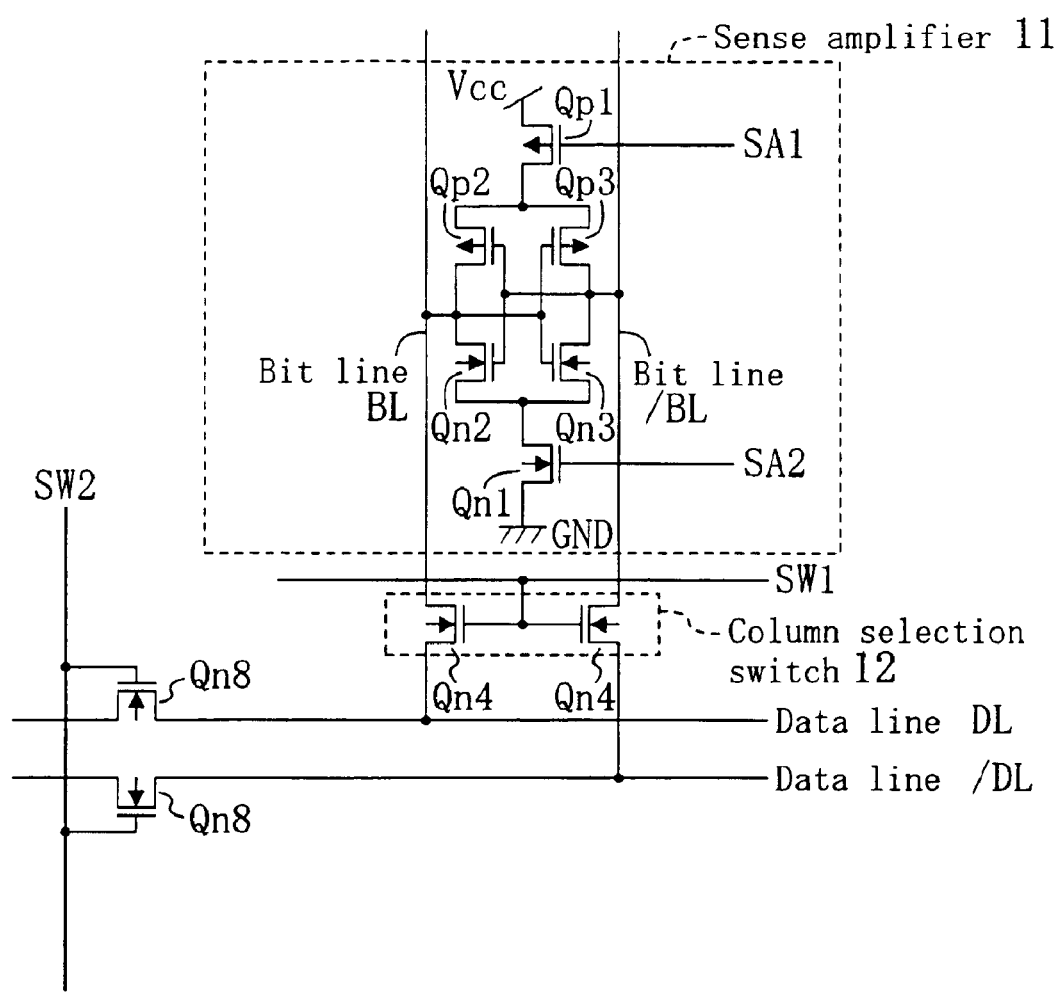
FIG. 9 illustrates the circuit configuration of a sense amplifier section and a data transfer circuit section including a column selection switch in a semiconductor memory device according to a fifth embodiment of the present invention.

FIG. 9 illustrates the circuit configuration of a sense amplifier section and a data transfer circuit section including a column selection switch in the semiconductor device according to the fifth embodiment.

As illustrated in FIG. 9, the sense amplifier 11 of the semiconductor device of the present embodiment includes the first, second and third P-channel MOS transistors Qp1, Qp2 and Qp3 and the first, second and third N-channel MOS transistors Qn1, Qn2 and Qn3, as in the first embodiment.

Moreover, the column selection switch 12 of the semiconductor device of the present embodiment for turning ON/OFF the connection between the pair of bit lines BL and /BL and the pair of data lines DL and /DL includes the pair of N-channel MOS transistors Qn4, as in the first embodiment. The column selection signal SW1 is input to the gate electrode of each N-channel MOS transistor Qn4.

A feature of the present embodiment is that each of the data lines DL and /DL is provided with an N-channel MOS transistor Qn8, being a data line dividing switch for selectively dividing or not dividing the data line, in order to decrease the total capacitance of the data lines DL and /DL in a read operation. The control signal SW2 is input to the gate electrode of each N-channel MOS transistor Qn8.

Figure 10:
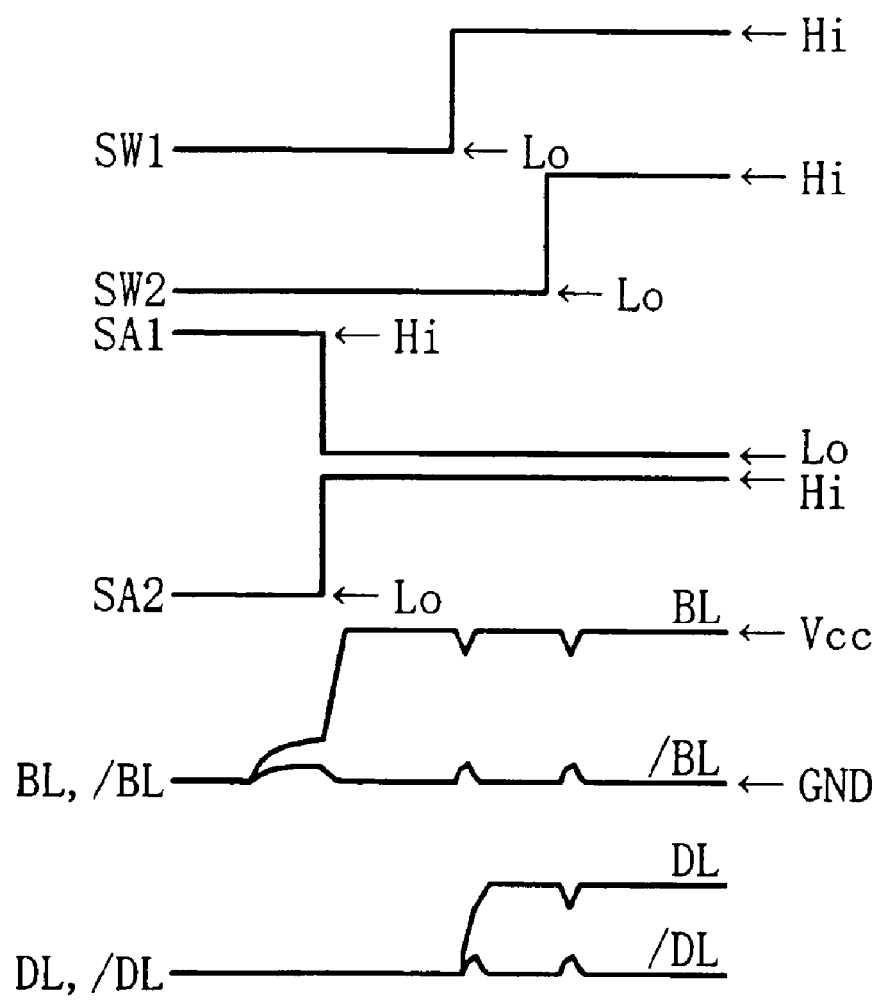
FIG. 10 is a timing chart illustrating a read operation of the semiconductor device according to the fifth embodiment of the present invention.
Figure 11:
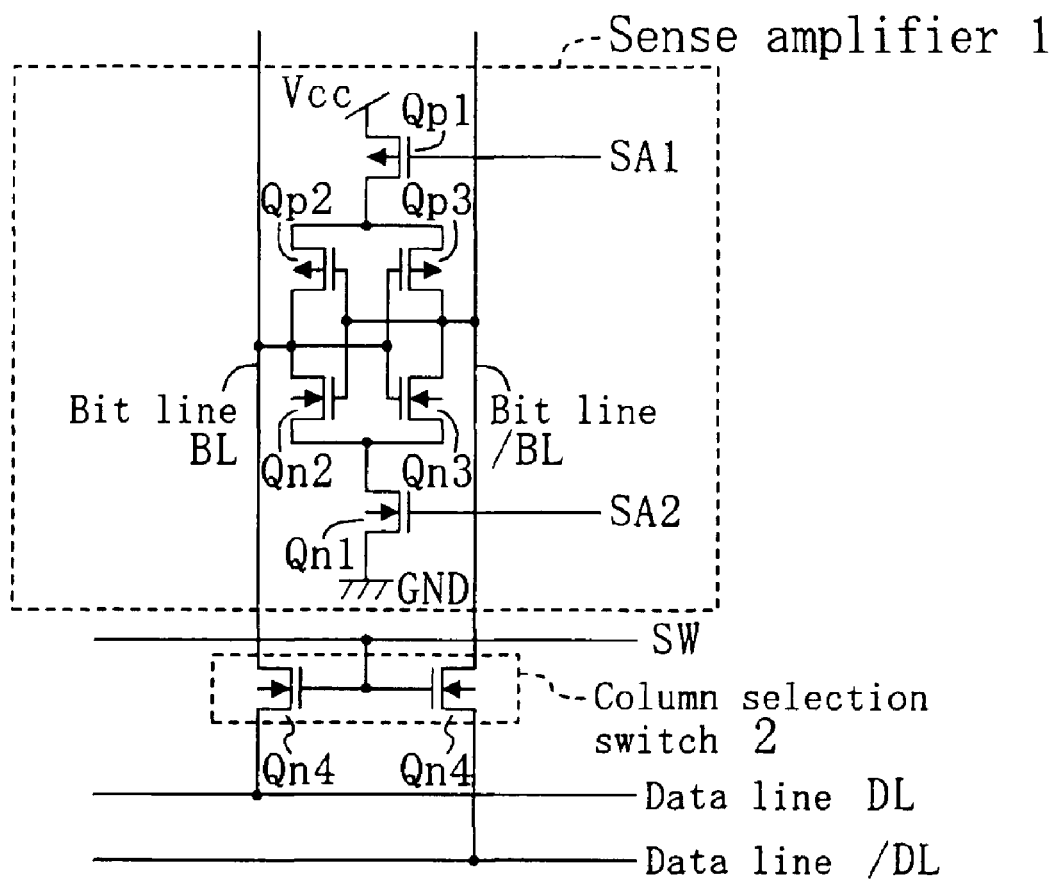
FIG. 11 illustrates the circuit configuration of a sense amplifier section and a data transfer circuit section including a column selection switch in a conventional semiconductor memory device.
Figure 12:
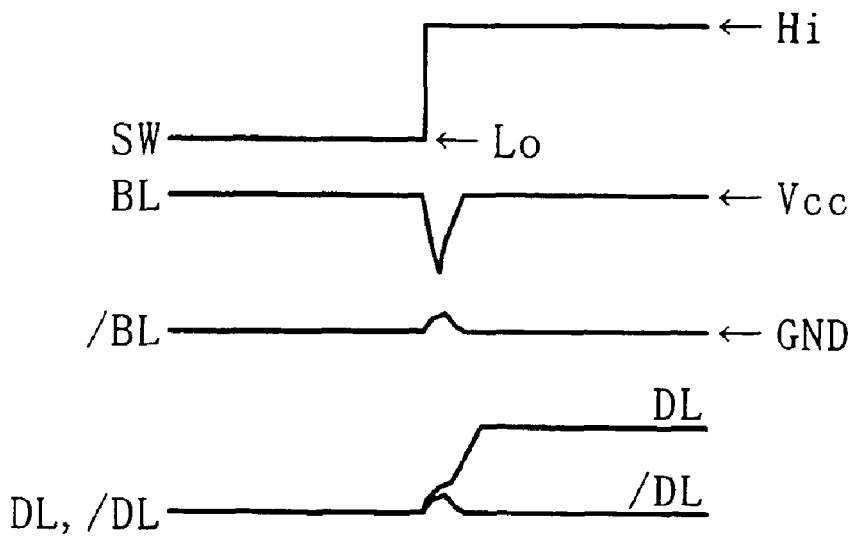
FIG. 12 illustrates the potential transition of the bit lines and the data lines when data is normally transferred from the bit lines to the data lines in the conventional semiconductor memory device.
Figure 13:
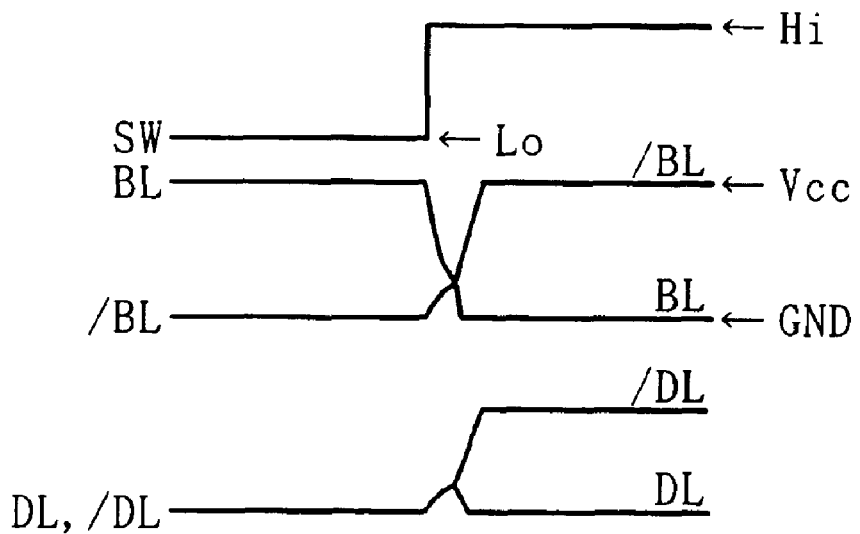
FIG. 13 illustrates the potential transition of the bit lines and the data lines when data is misread in the conventional semiconductor memory device.

Next, the operation of the semiconductor device of the present embodiment will be described in detail with reference to the timing chart of FIG. 10.

After data is read from a selected memory cell (not shown) to the bit lines BL and /BL, the state of each of the control signals SA1 and SA2 is transitioned so as to activate the sense amplifier 11. Then, as the column selection signal SW1 is brought from the low level to the high level, the MOS transistors Qn4 of the column selection switch 12 are turned ON, whereby a charge flows from the bit line BL to the data line DL to increase the potential of the data line DL. In the present embodiment, up to this point in time, the MOS transistors Qn8, being data line dividing switches, are kept OFF, so that the data lines DL and /DL are divided. Therefore, although at the moment the MOS transistors Qn4 are turned ON, there occurs a charge current to the data line DL, the total capacitance of the data line DL is sufficiently small, whereby the potential decrease of the bit line BL is small. Then, after the potential level of the bit line BL rises back to a sufficient level, the control signal SW2 is brought from the low level to the high level, thereby turning ON the MOS transistors Qn8, being data line dividing switches, and thus transferring data from the bit line BL to the data line DL. Since the capacitance of the data line DL, which increases as the MOS transistor Qn8 is turned ON, is sufficiently small, the potential decreases in the data line DL and the bit line BL are small. Moreover, the total capacitance of the data line DL is sufficiently small, whereby even when the state of the control signal SW1 or the control signal SW2 is transitioned, the potential of the bit line BL will not be less than or equal to the threshold of the P-channel MOS transistor Qp3 that connects the bit line /BL with the power supply of the sense amplifier 11. Thus, the MOS transistor Qp3 is not turned ON, whereby the MOS transistor Qn3 is sufficiently ON. Therefore, even if the potential of the data line /DL is slightly increased by the interference between the data lines, thereby causing a slight potential increase also in the bit line /BL connected to the data line /DL, no further potential increase will occur in the bit line /BL.

Therefore, according to the fifth embodiment, the potential relationship between the pair of bit lines BL and /BL can be stabilized so that data is normally transferred from the bit line BL or /BL to the data line DL or /DL, whereby it is possible to prevent data from being corrupted or misread in a read operation.

Note that in the fifth embodiment, in a case where the MOS transistors Qn4 of the column selection switch 12 are turned ON, OFF, and then ON again, similar effects to those of the present embodiment can be obtained by turning OFF the MOS transistors Qn8, being data line dividing switches when turning OFF the MOS transistors Qn4, and then turning ON the MOS transistors Qn8 after the MOS transistors Qn4 are turned ON again.

Moreover, in the fifth embodiment, the number of data line dividing switches provided along the data line DL or /DL is not limited to any particular number. Similar effects to those of the present embodiment can be obtained even when a plurality of data line dividing switches are provided along the data line DL or /DL so that the data line DL or /DL is divided into three or more portions in series with one another.

What is claimed is:

1. A semiconductor device, comprising:
   a differential sense amplifier connected to a bit line; and
   a data transfer circuit including a column selection switch for turning ON/OFF the connection between a data line and the bit line,
   wherein the column selection switch includes a read column selection switch and a write column selection switch, and
   wherein the bit line is connected to the same data line via the read column selection switch and the write column selection switch, separately.

2. The semiconductor device of claim 1, wherein an on-state resistance of the read column selection switch is higher than that of the write column selection switch.

3. The semiconductor device of claim 1, wherein the read column selection switch and the write column selection switch are connected to the data line via a common impurity diffusion layer.

4. A semiconductor device, comprising:
   a first differential sense amplifier connected to a first bit line;
   a second differential sense amplifier connected to a second bit line and being adjacent to the first differential sense amplifier; and
   a data transfer circuit including a first column selection switch for turning ON/OFF the connection between a data line and the first bit line, and a second column selection switch for turning ON/OFF the connection between the data line and the second bit line,
   wherein the first column selection switch includes a first read column selection switch and a first write column selection switch,
   the second column selection switch includes a second read column selection switch and a second write column selection switch,
   the first bit line is connected to the same data line via the first read column selection switch and the first write column selection switch, separately,
   the second bit line is connected to the same data line via the second read column selection switch and the second write column selection switch, separately, and
   all connection portions between the data line and each of the first read column selection switch, the first write column selection switch, the second read column selection switch, and the second write column selection switch comprise a common impurity diffusion layer.

* * * * *